US 6,551,114 B2

(12) United States Patent
Andric et al.

(10) Patent No.: US 6,551,114 B2
(45) Date of Patent: Apr. 22, 2003

(54) SEMICONDUCTOR DEVICE HAVING SIGNAL CONTACTS AND HIGH CURRENT POWER CONTACTS

(75) Inventors: Anthony Andric, Lockhart, TX (US); Ruel Hill, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/789,141

(22) Filed: Feb. 20, 2001

(65) Prior Publication Data

US 2002/0115325 A1 Aug. 22, 2002

(51) Int. Cl.[7] .............................................. H01R 12/00
(52) U.S. Cl. ......................................... 439/70; 257/698
(58) Field of Search ........................... 439/259, 70, 71, 439/342, 266; 257/690, 691, 692, 698

(56) References Cited

U.S. PATENT DOCUMENTS

| | | | |
|---|---|---|---|
| 4,330,163 A | * | 5/1982 | Aikens et al. |
| 5,258,648 A | * | 11/1993 | Lin ............................. 257/778 |
| 5,342,213 A | * | 8/1994 | Kobayashi ................. 439/268 |
| 5,483,099 A | | 1/1996 | Natarajan et al. ........... 257/691 |
| 5,489,218 A | * | 2/1996 | McHugh ..................... 439/342 |
| 5,528,083 A | * | 6/1996 | Malladi et al. ............. 257/723 |
| 5,703,402 A | * | 12/1997 | Chu et al. .................. 257/737 |
| 5,721,673 A | | 2/1998 | Klein .......................... 361/809 |
| 5,903,050 A | * | 5/1999 | Thurairajaratnam et al. ........................... 257/695 |
| 6,020,637 A | * | 2/2000 | Karnezos .................... 257/738 |
| 6,064,113 A | * | 5/2000 | Kirkman ..................... 257/691 |
| 6,075,710 A | * | 6/2000 | Lau ............................. 361/760 |
| 6,084,777 A | * | 7/2000 | Kalidas et al. .............. 257/707 |
| 6,140,581 A | * | 10/2000 | Cowan et al. ............... 165/185 |
| 6,160,705 A | * | 12/2000 | Stearns et al. .............. 174/252 |
| 6,168,449 B1 | * | 1/2001 | Huang et al. ............... 439/259 |
| 6,186,812 B1 | * | 2/2001 | Ramsey et al. ............. 439/266 |
| 6,297,550 B1 | * | 10/2001 | Chia et al. .................. 174/252 |

OTHER PUBLICATIONS

International Search Report dated Nov. 4, 2002 (PCT/US02/03557; TT3948–PCT).

* cited by examiner

Primary Examiner—Tulsidas Patel
(74) Attorney, Agent, or Firm—Williams, Morgan & Amerson, P.C.

(57) ABSTRACT

A semiconductor device includes a casing, a semiconductor die supported by the casing, at least one contact pad disposed on a bottom surface of the semiconductor device, and a plurality of external contacts extending from the casing and being coupled to the semiconductor die. A circuit assembly includes a printed circuit board, a semiconductor device, and a socket. The semiconductor device includes a casing, a semiconductor die supported by the casing, at least one contact pad disposed on a bottom surface of the semiconductor device, and a plurality of external contacts extending from the casing and being coupled to the semiconductor die. The socket is coupled to the printed circuit board and adapted to receive the semiconductor device. The socket includes a first plurality of contacts adapted to interface with the external contacts of the semiconductor device and at least one base contact adapted to interface with the contact pad.

23 Claims, 4 Drawing Sheets

SEMICONDUCTOR DEVICE HAVING SIGNAL CONTACTS AND HIGH CURRENT POWER CONTACTS

BACKGROUND OF THE INVENTION

1. Field of the Invention

This invention relates generally to the field of electrical connectors for semiconductor devices and, more particularly, to a semiconductor device having signal contacts and high current power contacts.

2. Description of the Related Art

Typically, electrical connectors having various configurations are employed for attaching integrated-circuit (IC) modules to printed-circuit (PC) boards. Such connectors provide versatility to computer platforms by allowing major components, such as microprocessors, to be easily removed and replaced with upgraded units. For example, one type of connector that is used for such a purpose is a zero-insertion-force (ZIF) sockets. A ZIF socket is useful in that very little downward force need be exerted as the device is being inserted or latched into the connector. Because no force is required, the potential for damage to the delicate signal pins of the component being inserted is reduced. The type of semiconductor device package that interfaces with a ZIF socket is referred to a pin grid array (PGA). A PGA package has a plurality of signal and power pins extending from the package, typically in a single plane.

One problem associated with a PGA package is the limited current carrying capacity of each pin. Accordingly, many pins are needed to provide sufficient power and ground supplies for the semiconductor device. As the complexity of current microprocessors increases, the power demands typically also increase. In addition, the number of pins needed for signals also increases (e.g., a 64-bit microprocessor requires more pins than a 32-bit microprocessor). Due to the current requirements of typical microprocessors, as many as ⅔ of the total number of pins may be dedicated for supplying power. This domination of the pins count constrains the number of pins remaining for signals. Additional pins equate to additional size and cost. The use of larger pins for power supply contacts to boost their current carrying capacity is impractical, as it increases the complexity of the assembly process.

The present invention is directed to overcoming, or at least reducing the effects of, one or more of the problems set forth above.

SUMMARY OF THE INVENTION

One aspect of the present invention is seen in a semiconductor device includes a casing, a semiconductor die supported by the casing, at least one contact pad disposed on a bottom surface of the semiconductor device, and a plurality of external contacts extending from the casing and being coupled to the semiconductor die.

Another aspect of the present invention is seen in a circuit assembly including a printed circuit board, a semiconductor device, and a socket. The semiconductor device includes a casing, a semiconductor die supported by the casing, at least one contact pad disposed on a bottom surface of the semiconductor device, and a plurality of external contacts extending from the casing and being coupled to the semiconductor die. The socket is coupled to the printed circuit board and adapted to receive the semiconductor device. The socket includes a first plurality of contacts adapted to interface with the external contacts of the semiconductor device and at least one base contact adapted to interface with the contact pad.

BRIEF DESCRIPTION OF THE DRAWINGS

The invention may be understood by reference to the following description taken in conjunction with the accompanying drawings, in which like reference numerals identify like elements, and in which.

Figure 1:
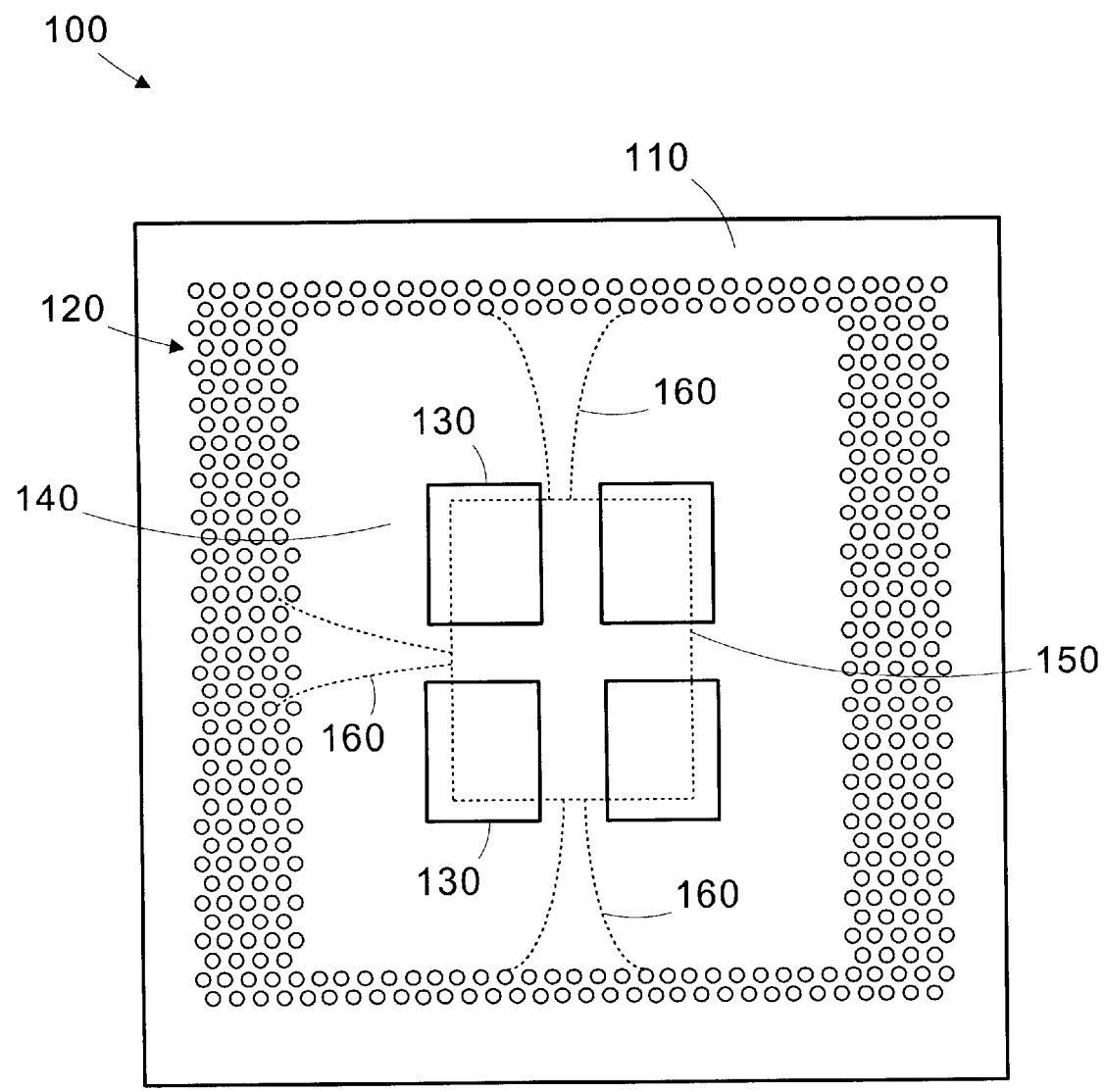
FIG. 1 is a bottom view of an integrated circuit package in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Detailed Description of Specific Embodiments

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified bottom view of an integrated circuit package 100 in accordance with the present invention is shown. In the illustrated embodiment, the integrated circuit package 100 is a microprocessor, although other devices may be used. The integrated circuit package 100 has a casing 110 (e.g. ceramic), through which a plurality of contact pins 120 extend. Typically, the contact pins 120 are adapted to carry logic signals, addresses, data, etc. A plurality of contact pads 130 are formed on the bottom surface 140 of the ceramic casing 110. A semiconductor die 150 (shown using phantom lines) is supported by the casing 110 in the integrated circuit package 100. In the illustrated embodiment, the semiconductor die 150 is a flip chip package, where the die 150 is soldered to an upper surface of the casing 110.

The contact pads 130 have a higher current-carrying capacity than the contact pins 120, and, hence, are useful for providing power and ground signals to the integrated circuit package 100. Supplying power and ground signals through the contact pads 130, as opposed to the contact pins 120, frees up contact pin 120 resources for carrying signals without requiring an increased package size. The particular number of contact pads 130 is application dependent, and may vary depending on factors such as the layout of the semiconductor die 150 and the power requirements of the semiconductor die 150. To enhance the corrosion resistance of the contact pads 130, they may be coated with solder paste at the same time the contact pins 120 are attached to the casing 110 during assembly. Alternatively, the contact pads 130 may be gold plated. Forming the contact pads 130 on the bottom of casing 110, as opposed to using separate higher current contact pins, simplifies assembly. Only one type of external contacts (i.e., the contact pins 120) need be attached.

Figure 2:
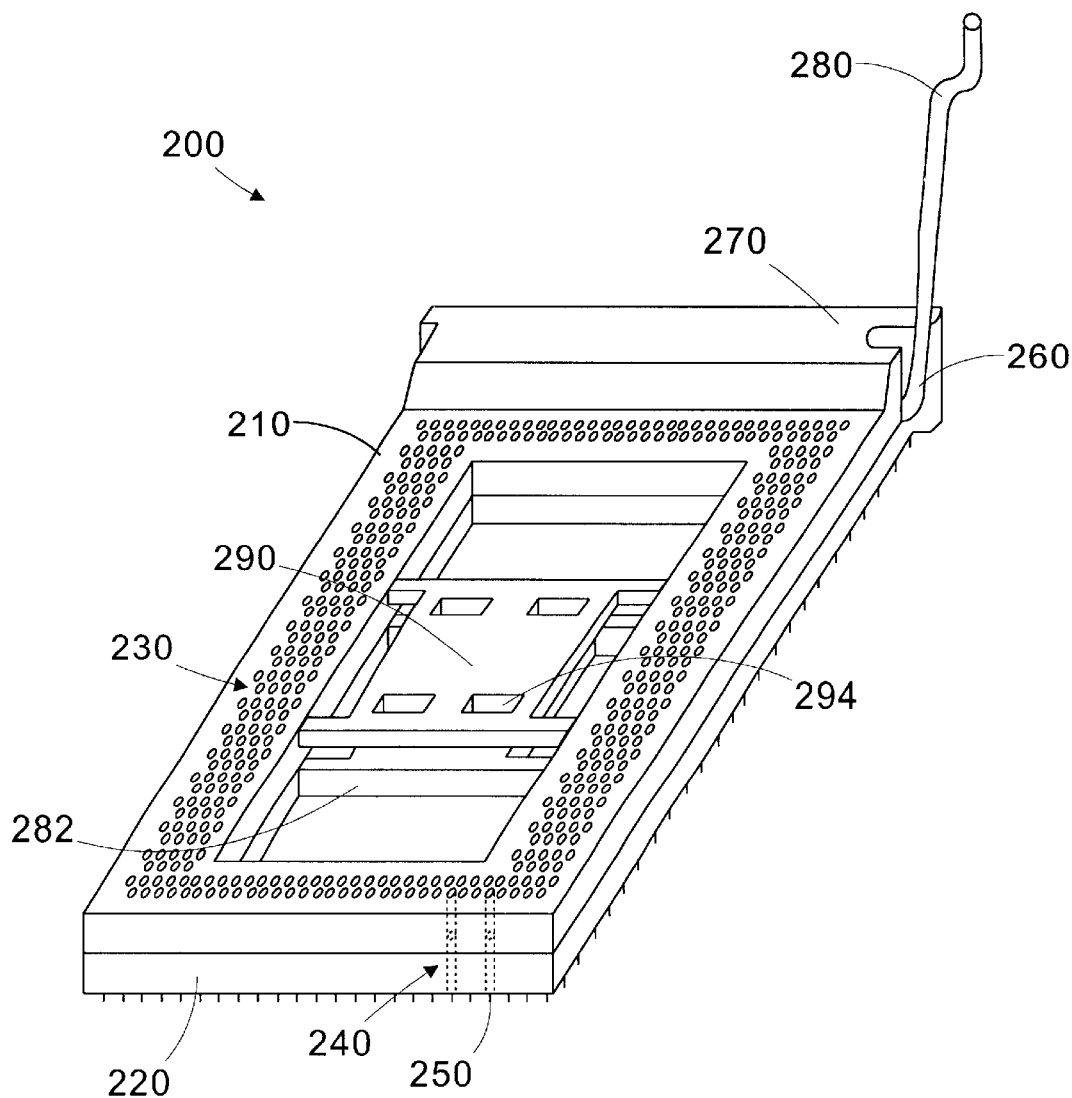
FIG. 2 is an isometric view of a socket adapted to receive the integrated circuit package of FIG. 1.

The integrated circuit package 100 is suited for installation on a printed circuit board (not shown). A socket 200 for receiving the integrated circuit package 100 is shown and described in greater detail in reference to FIG. 2. As shown in FIG. 2, the socket 200 includes a top plate 210 that is slidingly attached to a base 220. The top plate 210 has a plurality of openings 230, and the base 220 contains a corresponding plurality of openings 240. The openings 240 house contacts 250 that extend from the base 220 to engage the printed circuit board circuitry (not shown), where they are soldered in place. The socket 210 further includes a camshaft 260 located inside a raised portion 270 of the top plate 210. Rotation of a lever 280 causes the camshaft 260 to act on the base 220, displacing the top plate 210 with respect to base 220, which is anchored to the printed circuit board (not shown) via the contacts 250.

When the integrated circuit package 100 of FIG. 1 is inserted into the open socket 200, the contact pins 120 of the integrated circuit package 100 protrude through the openings 230, 240 of the top plate 210 and the base 220, respectively. With the socket 200 in its open position, the openings 230 in the top plate 210 are aligned with the corresponding openings 240 in the base 220, but the contact pins 120 are not aligned with the contacts 250. As the lever 280 is rotated downwardly, the camshaft 260 exerts a force on the base 220, causing the top plate 210 to translate relative to the base 220, such that the contact pins 120 of the integrated circuit package 100 and contacts 250 align and engage. Each of the features of the socket 200 described to this point can be found in conventional zero insertion-force-sockets, such as are available from AMP, Inc. as model no. 916788-1.

The socket 200 of the instant invention further includes a base contact support member 282 for supporting a plurality of base contacts 285 (shown in FIGS. 3A and 3B) and a fulcrum member 290. The base contacts 285 are mounted to the printed circuit board (not shown) for providing the power and ground signals to the contact pads 130 of the integrated circuit package 100 of FIG. 1. The base contacts extend through slots 292 (shown in FIGS. 3A and 3B) defined in the base contact support member 282 and corresponding slots 294 defined in the fulcrum member 290. In the illustrated embodiment, the base contacts 285 are cantilevered spring contacts. The base contacts 285 may be constructed of a spring metal. The slots 294 defined in the fulcrum member 290 include a sloped surface 296 (shown in FIGS. 3A and 3B) that engages the base contacts 285 as the lever 280 is rotated downwardly and pushes upwardly on the base contacts 285, urging the base contacts 285 against the contact pads 130. This engagement enhances the contact between the base contacts 285 and the contact pads 130 of the integrated circuit package 100. In some embodiments, the base contact support member 282 may be omitted and the base contacts 285 may be attached directly to the circuit board. However, the base contact support member 282 provides an assembly advantage in that it retains the base contacts 285 with the remainder of the socket 200 such that they may be easily aligned as the socket 200 is mounted to the circuit board. The fulcrum member 290 may be omitted, leaving the spring force of the base contacts 285 alone to provide the connective force.

Many different constructs for the base contacts 285 are possible. The base contacts 285 may have a variety of cross-section shapes, such as, but not limited to a c-shaped cross section, an s-shaped cross-section, a rectangular shaped cross-section, etc. Moreover, other means for providing an upward force to the base contacts 285 may be employed.

In embodiments without the fulcrum member 290, a small downward force may be required during the insertion of the integrated circuit package 100 into the socket 200 to ensure compression of the base contacts 285 and full engagement of the contact pins 120. In embodiments employing the fulcrum member 290, the position of the fulcrum member 290 and the slope of the sloped surface 295 may be configured such that the fulcrum member 290 does not assert an upward force until after the contact pins 120 of the integrated circuit package 100 and base contacts 250 have begun to engage. Accordingly, the need for a downward insertion force may be obviated.

Figure 3A:
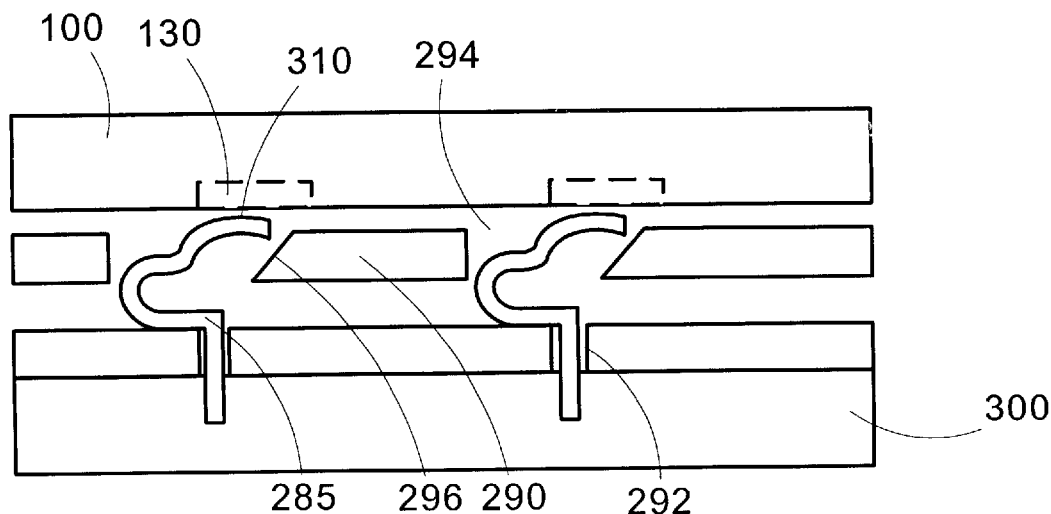
FIGS. 3A and 3B are a cross-section view of the integrated circuit package of FIG. 1 and the socket of FIG. 2.
Figure 3B:
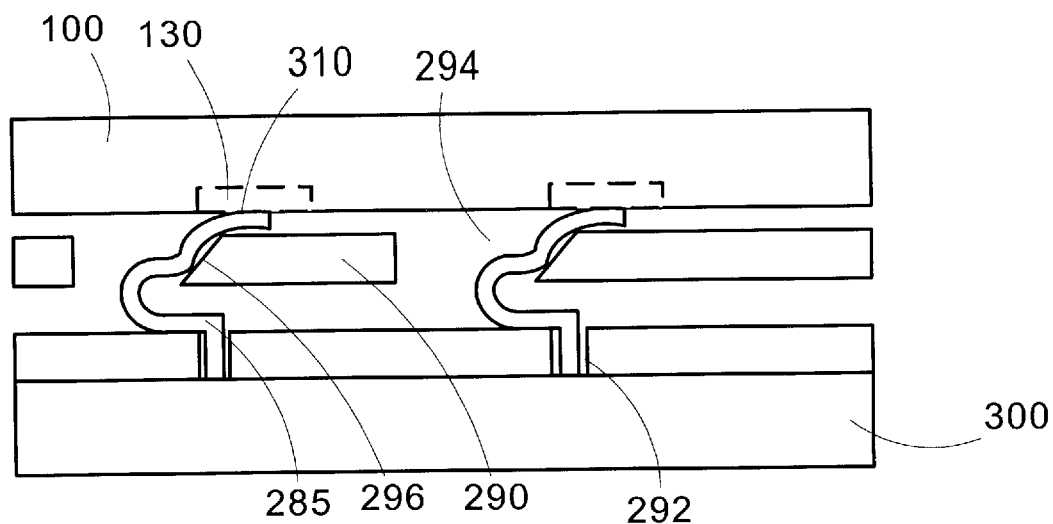

Turning now to FIGS. 3A and 3B, cross section views of the integrated circuit package 100 and socket 200 illustrating the engagement of the fulcrum member 290 and base contacts 285 is provided. For clarity and ease of illustration, not all portions of the integrated circuit package 100 and socket 200 are depicted in the views of FIGS. 3A and 3B. The socket 200 is shown coupled to a printed circuit board 300. When the socket 200 is in the open position, as shown in FIG. 3A, the fulcrum member 290 does not engage the base contacts 285. As the lever 280 is rotated to the closed position the fulcrum member 290 moves toward the base contacts 285, as seen in FIG. 3B. When the sloped surfaces 296 of the fulcrum member 290 engages beam portions 310 of the base contacts 285, an upward force is created, deflecting the beam portions 310 toward the contact pads 130 and holding them in engagement therewith.

The combination of the integrated circuit package 100 and socket 200 has numerous advantages. First, the contact pads 130 allow transmission of the ground and power reference signals to the semiconductor die 150 without tying up a large number of contact pins 120 on the integrated circuit package 100. Second, forming the contact pads 130 as an integral part of the semiconductor die 150 obviates the need for two types of external contacts on the integrated circuit package 100. Third, the base contact support member 282 and the fulcrum member 290 are integrated into the socket 200 allowing for easy fabrication.

Figure 4:
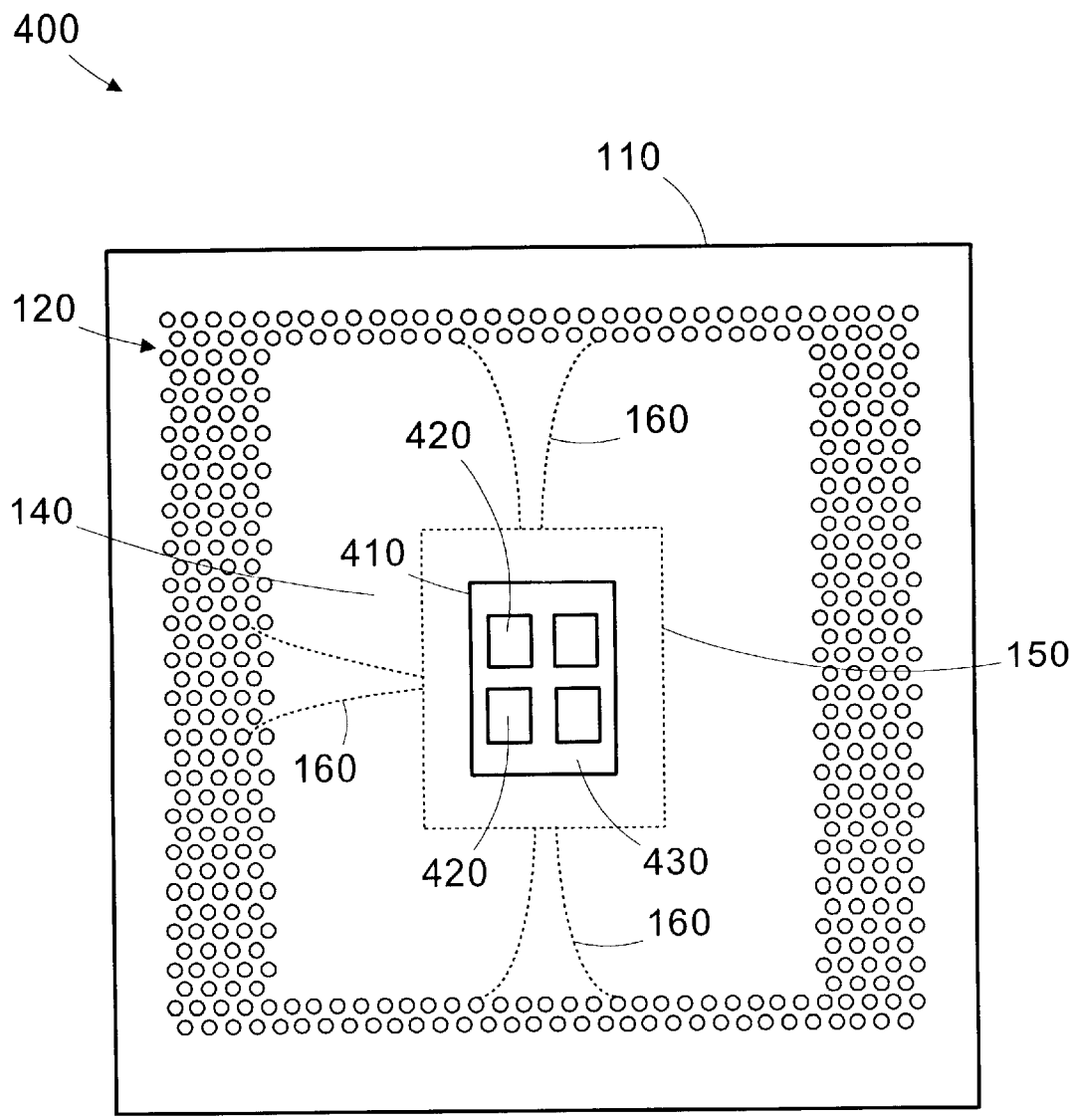
FIG. 4 is a bottom view of an alternative embodiment of the integrated circuit package of FIG. 1 in accordance with the present invention.

Referring to FIG. 4, an alternative embodiment of an integrated circuit package 400 is shown. In the embodiment of FIG. 4, a window 410 is formed in the bottom surface 140 of the casing 110 exposing a portion of the semiconductor die 150. Contact pads 420 are disposed on a bottom surface 430 of the semiconductor die 150, as opposed to on the bottom surface 140 of the casing 110, as in the embodiment of FIG. 1. The socket 200 of FIG. 2 may be employed with the integrated circuit package 100 of FIG. 4 in a similar manner. The base contacts 285 (shown in FIGS. 3A and 3B) interface with the contact pads 420. The embodiments of FIGS. 1 and 4 are similar in that the contact pads 130, 420 are formed on a bottom surface of the package 100, allowing them to interface with the socket 200 and providing a high current connection thereto.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a casing;
    a semiconductor die supported by the casing, the casing having an opening exposing at least a portion of the semiconductor die;
    at least one exposed contact pad disposed on the exposed portion of the semiconductor die, the exposed contact pad being connectible to a device external to the casing; and
    a plurality of external contacts extending from the casing and being coupled to the semiconductor die, the contact pad having a higher current-carrying capacity than each of the external contacts.

2. The semiconductor device of claim 1, wherein the external contacts comprise pin contacts.

3. The semiconductor device of claim 1, wherein the external contacts comprise signal contacts, and the contact pad comprises at least one of a power and a ground contact.

4. The semiconductor device of claim 1, wherein the semiconductor die includes a plurality of contact pads.

5. The semiconductor device of claim 4, wherein the contact pads comprises power and ground contacts.

6. A circuit assembly, comprising:
    a printed circuit board;
    a semiconductor device, comprising:
        a casing;
        a semiconductor die supported by the casing;
        at least one exposed contact pad disposed on a bottom surface of one of the casing and the semiconductor die; and
        a plurality of external contacts extending from the casing and being coupled to the semiconductor die, the contact pad having a higher current-carrying capacity than each of the external contacts; and
    a socket coupled to the printed circuit board and adapted to receive the semiconductor device, the socket comprising:
        a first plurality of contacts adapted to interface with the external contacts of the semiconductor device;
        at least one base contact adapted to interface with the contact pad;
        a base portion haveing a first plurality of openings, wherein the first plurality of contacts are coupled to the printed circuit board and disposed within the first plurality of openings; and
    a top portion slidingly attached to the base portion, the top portion including a second plurality of openings corresponding to the first plurality of openings in the base portion.

7. The circuit assembly of claim 6, wherein the base contact is coupled to the printed circuit board.

8. The circuit assembly of claim 6, wherein the external contacts of the semiconductor device are adapted to extend through the first and second pluralities of openings to engage the first plurality of contacts when the socket is in a closed position.

9. The circuit assembly of claim 6, wherein the socket further comprises a fulcrum member extending from the top portion, the fulcrum member being adapted to engage the base contact as the socket transitions from an open position to a closed position.

10. The circuit assembly of claim 9, wherein the base contact has a beam portion and the fulcrum member is adapted to deflect the beam portion toward the contact pad.

11. The circuit assembly of claim 10, wherein the fulcrum member includes a sloped surface adapted to engage the beam portion.

12. The circuit assembly of claim 6, wherein the base contact comprises a spring contact.

13. The circuit assembly of claim 6, wherein the external contacts comprise pin contacts.

14. The circuit assembly of claim 6, wherein the external contacts comprise signal contacts, and the contact pad comprises at least one of a power and a ground contact.

15. The circuit assembly of claim 6, wherein the semiconductor die includes a plurality of contact pads.

16. The circuit assembly of claim 15, wherein the contact pads comprise power and ground contacts.

17. The circuit assembly of claim 6, wherein the socket further comprises a base contact support member extending from the bottom portion, the base contact support member being adapted to support the base contact.

18. The circuit assembly of claim 17, wherein a first slot is defined in the base contact support member, and the base contact is disposed in the slot.

19. The circuit assembly of claim 9, wherein the socket further comprises a base contact support member extending from the bottom portion, the base contact support member being adapted to support the base contact.

20. The circuit assembly of claim 19, wherein a first slot is defined in the base contact support member, and the base contact is disposed in the slot.

21. The circuit assembly of claim 20, wherein a second slot is defined in the fulcrum member, and the first slot communicates with the second slot.

22. The circuit assembly of claim 21, wherein the base contact has a beam portion and the second slot includes a sloped surface adapted to engage the beam portion and deflect the beam portion toward the contact pad.

23. A circuit assembly, comprising:
    a printed circuit board,
    a semiconductor device, comprising:
        a casing;
        a semiconductor die supported by the casing, the casing having an opening exposing at least a portion of the semiconductor die;
        at least one exposed contact pad disposed on the exposed portion of the semiconductor die; and
        a plurality of external contacts extending from the casing and being coupled to the semiconductor die the contact pad having a higher current-carrying capacity than each of the external contacts; and
    a socket coupled to the printed circuit board and adapted to receive the semiconductor device, the socket comprising:
        a first plurality of contacts adapted to interface with the external contacts of the semiconductor device; and
        at least one base contact adapted to interface with the contact pad.

* * * * *